(12) United States Patent
Tajimi

(10) Patent No.: US 7,811,922 B2
(45) Date of Patent: Oct. 12, 2010

(54) METHOD FOR MANUFACTURING SEMICONDUCTOR DEVICE

(75) Inventor: Shigehisa Tajimi, Shonai-machi (JP)

(73) Assignee: Seiko Epson Corporation, Tokyo (JP)

( * ) Notice: Subject to any disclaimer, the term of this patent is extended or adjusted under 35 U.S.C. 154(b) by 213 days.

(21) Appl. No.: 12/046,540

(22) Filed: Mar. 12, 2008

(65) Prior Publication Data

US 2008/0224310 A1    Sep. 18, 2008

(30) Foreign Application Priority Data

Mar. 16, 2007    (JP)    ............................. 2007-069190

(51) Int. Cl.
*H01L 21/44*    (2006.01)
(52) U.S. Cl. .................... 438/614; 438/108; 438/613; 438/E21.001; 438/E23.141
(58) Field of Classification Search ......... 438/106–109, 438/112, 126, 612–624; 257/691, 778–779, 257/E21.001, E23.141
See application file for complete search history.

(56) References Cited

U.S. PATENT DOCUMENTS 6,831,000 B2 * 12/2004 Murayama .................. 438/613

7,041,591 B1 * 5/2006 Lee et al. .................... 438/614

FOREIGN PATENT DOCUMENTS

JP    A-2006-344870    12/2006

* cited by examiner

*Primary Examiner*—Dung A. Le
(74) *Attorney, Agent, or Firm*—Oliff & Berridge, PLC

(57) ABSTRACT

A method for manufacturing a semiconductor device includes: preparing a wiring board having a base substrate and wiring that is plated on surface with a plating metal; pressing a bump that is formed on the active side of the semiconductor chip against an end part of the wiring of the wiring board, thereby exfoliating the area surrounding the pressed portion of the wiring from the base substrate while keeping the end of the wiring bonded with the base substrate; melting the plating metal that is located on the end part of the wiring, thereby causing the plating metal and the bump to form an alloy that bonds the bump and the wiring and infiltrate the plating metal into a space between the wiring and the base substrate; and judging that the bump and the wiring are well bonded if the plating metal has infiltrated a space between the wiring and the base substrate so as to have an area, width or length of infiltration that exceeds a reference value.

4 Claims, 3 Drawing Sheets

METHOD FOR MANUFACTURING SEMICONDUCTOR DEVICE

The entire disclosure of Japanese Patent Application No. 2007-069190, filed Mar. 16, 2007 is expressly incorporated by reference herein.

BACKGROUND OF THE INVENTION

1. Technical Field

The present invention relates to a method for manufacturing a semiconductor device and a semiconductor device, the method including bonding a semiconductor chip upon a wiring board. Particularly, the invention relates to a method for manufacturing a semiconductor device and a semiconductor device, the method permitting judgment to be performed in a nondestructive manner as to whether the bonding between a semiconductor device and a wiring board is good or bad.

2. Related Art

FIG. 5 is a cross-sectional view for explaining the structure of a semiconductor device having a semiconductor chip 110 mounted on a wiring board. As illustrated, copper wiring 122 is formed on a base substrate 120 of the wiring board. The copper wiring 122, except for an end part 122a thereof, is plated with a protective resin layer 124. The end part 122a of the copper wiring 122 is plated with a plated layer (not illustrated). A bump 11a of the semiconductor chip 110 alloys with the plated layer formed on the end part 122a to form a eutectic alloy, thereby being bonded to the copper wiring 122.

JP-A-2006-344780 is an example of related art (FIG. 4).

It is important for improving the reliability of semiconductor devices to perform nondestructive testing to see whether the bonding between a bump of a semiconductor chip and a wiring board is good or bad. In the past, however, it has been difficult to see whether the bonding is good or bad by such nondestructive testing.

SUMMARY

An advantage of the present invention is to provide a method for manufacturing a semiconductor device and a semiconductor device, the method allowing judgment to be performed in a nondestructive manner as to whether the bonding between a semiconductor chip and a wiring board is good or bad.

A method for manufacturing a semiconductor device according to one aspect of the invention includes: preparing a wiring board having a base substrate and wiring that is plated on surface with a plating metal; pressing a bump that is formed on the active side of the semiconductor chip against an end part of the wiring of the wiring board, thereby exfoliating the area surrounding the pressed portion of the wiring from the base substrate while keeping the end of the wiring bonded with the base substrate; melting the plating metal that is located on the end part of the wiring, thereby causing the plating metal and the bump to form an alloy that bonds the bump and the wiring and infiltrate the plating metal into a space between the wiring and the base substrate; and judging that the bump and the wiring are well bonded if the plating metal has infiltrated a space between the wiring and the base substrate so as to have an area, width or length of infiltration that exceeds a reference value.

The method allows the judgment to be performed in a nondestructive manner as to whether the bonding between a semiconductor chip and a wiring board is good or bad.

In the case where a protective layer is formed on the substrate of the wiring board, covering the region other than the end part of the wiring, it is preferable that the distance between the portion pressed by the bump and the end of the wiring is at least 40 μm and the wiring has a thickness of 10 μm or less. A notch may be further included, being formed at the end part of the wiring and located near a region thereof where the bump is to be pressed. If the wiring is copper wiring, the plating metal is, for example, Sn.

A semiconductor device according to another aspect of the invention includes a wiring board that has a substrate, wiring on a substrate, and a plating metal formed on a surface of the wiring; and a semiconductor chip that is mounted on the wiring board and has a bump on its active side. In the semiconductor device, the bump is bonded with the wiring and the wiring has a notch that is located around a portion of the wiring bonded with the bump.

BRIEF DESCRIPTION OF THE DRAWINGS

The invention will be described with reference to the accompanying drawings, wherein like numbers reference like elements.

EXEMPLARY EMBODIMENTS OF THE INVENTION

Embodiments of the invention will now be described.

First Embodiment

Figure 1A:
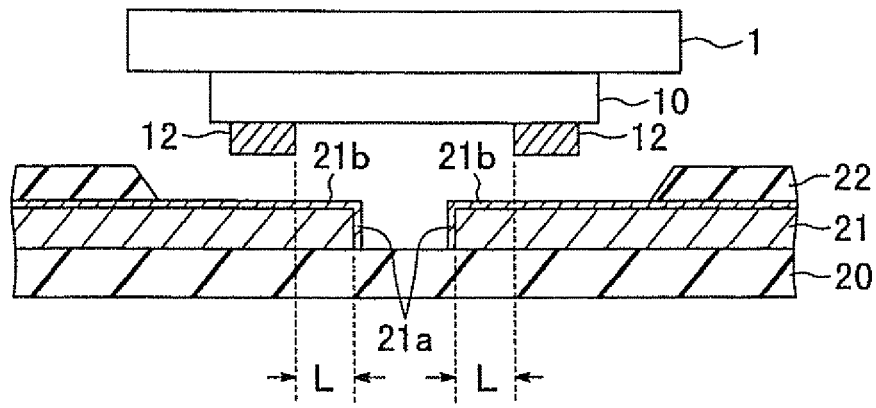
FIGS. 1A, 1B and 1C are cross-sectional views for explaining a method for manufacturing a semiconductor device according to a first embodiment of the invention.
Figure 1B:
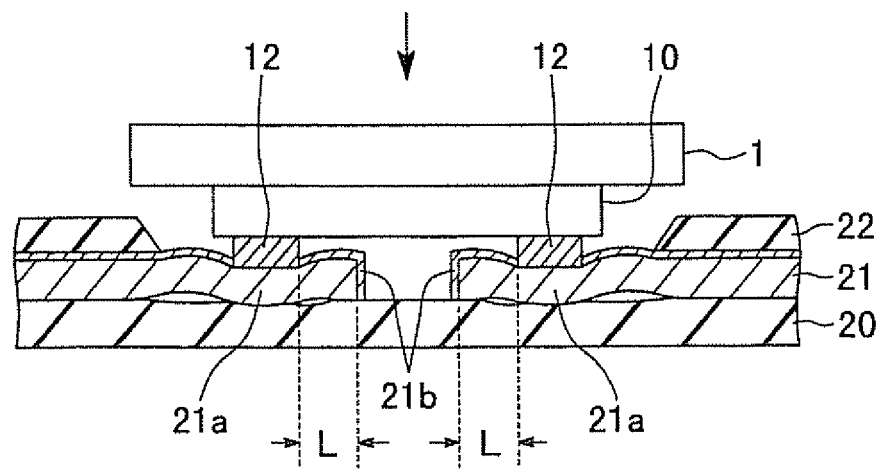
Figure 1C:
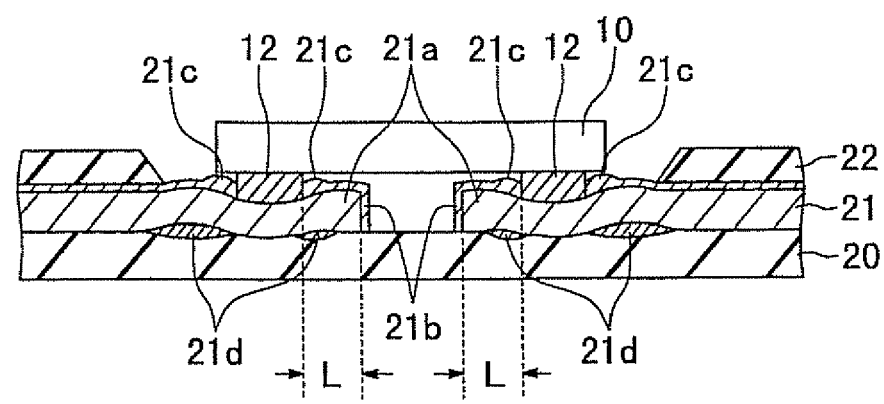

Referring to FIGS. 1A, 1B and 1C, a method for manufacturing a semiconductor device according to a first embodiment of the invention will be described. The method shown in the diagrams includes bonding a bump of a semiconductor chip to wiring on a wiring board and subsequently performing nondestructive testing to see whether the bonding between them is good or bad.

First, as shown in FIG. 1A, a wiring board having a base substrate 20, wiring 21 and a protective resin layer 22 is prepared. The base substrate 20 may be a flexible substrate, for example, but it may be a rigid substrate or a rigid flexible substrate. There is no particular restriction for the base substrate 20. A wiring layer may also be included within the base substrate 20.

The wiring 21 is formed on the base substrate 20. The wiring 21 may be formed directly on the base substrate 20, or it may be bonded on the base substrate 20, with an adhesive agent inbetween. The wiring 21 is formed by depositing any of Cu, Cr, Ti, Ni and Ti—W, for example, to form a single layer or a plurality of layers. A plated layer 21b is formed on the surface of the wiring 21. The plated layer 21b is Sn, for example, and is formed with a metal that alloys with both the wiring 21 and a bump to be described later. It is preferable that the wiring 21 has a thickness of 10 μm or less. This prevents the end of an end part 21a from exfoliating from the base substrate 20. Meanwhile, the wiring 21 is formed by forming a metal layer over the entire surface of the base substrate 20, and then selectively removing the metal layer. Methods for forming the metal layer include the sputtering method and a method in which a metal foil is bonded on the base substrate 20 using a adhesion layer.

The protective resin layer 22 coats a region of the wiring 21 excluding the end part 21a thereof. The protective resin layer 22 is solder resist, for example.

Furthermore, the wiring board is in some cases treated with heat in advance (precure) with a view to removing the moisture it has absorbed. If heat is excessively applied in this heat treating process, the bonding is badly performed in the bonding process to be described later due to acceleration of the alloying between the plated layer 21b and the wiring 21.

Then, a bonding tool 1 is used to hold the semiconductor chip 10 so that the active side of the semiconductor chip 10 faces the side, having wiring, of the base substrate 20 of the wiring board. The semiconductor chip 10 has a plurality of pads (not illustrated) and a bump 12 that is formed on each of the pads. The bump 12 is a gold bump, for example. With the active side of the semiconductor chip 10 facing the base substrate 20, the end part 21a of the wiring 21 faces the bump 12. It is preferable that the distance L between the end of the end part 21a and the portion of the bump nearest to the end of the end part 21a is at least 40 μm, as observed from a direction perpendicular to the base substrate 20 of the wiring board. This prevents the end of the end part 21a from exfoliating from the base substrate 20 in the bonding process to be described later.

Then, as shown in FIG. 1B, the bonding tool 1 is moved toward the wiring board to press the bump 12 of the semiconductor chip 10 with a constant force against the end part 21a of the wiring 21 of the wiring board. The pressing force is, for example, 10 mgf/μm$^2$ or more. This peels off the portion, surrounding the bump 12, of the end part 21a of the wiring 21. However, the end of the end part 21 remains bonded to the base substrate 20.

Then, as the bump 12 is pressed against the end part 21a, heat is applied to them, as shown in FIG. 1C. This causes the plated layer 21b to melt on the end parts 21a. Part of the melted plated layer 21b forms a eutectic alloy with the bump 12 and the end part 21a of the wiring 21, respectively, to form a fillet 21c, thereby bonding the bump 12 and the end part 21a. Furthermore, the other part of the melted plated layer 21b flows into a space created by the exfoliation of the end part 21a of the wiring 21 from the base substrate 20 and forms a plated metal infiltration part 21d.

In the case where the alloying of the plated layer 21b and the wiring 21 has progressed in the above described heat treating process (precure process) for removing moisture, the plated layer 21b does not melt in the bonding process, thereby preventing the plated metal infiltration part 21d either from being formed or from satisfying the reference value even if it is formed. Thus, the bonding between the end part of the wiring 21 and the bump 12 can be judged as good if the area, the width or the length of the plated metal infiltration part 21d either satisfies or surpasses the reference value. Meanwhile, the area, the width or the length of the plated metal infiltration part 21d can be visually measured in a nondestructive manner by using an optical microscope.

Figure 2A:
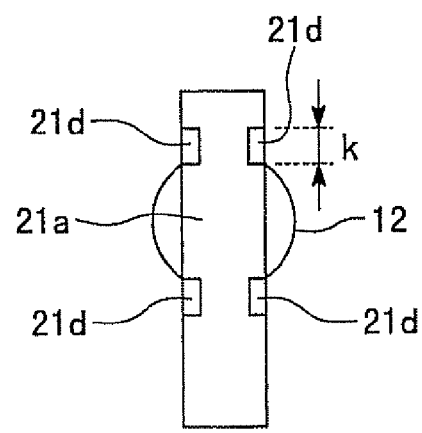
FIGS. 2A and 2B are pattern diagrams for explaining length k of a plated metal infiltration part 21d and whether bonding between a bump 12 and wiring 21 is good or bad.
Figure 2B:
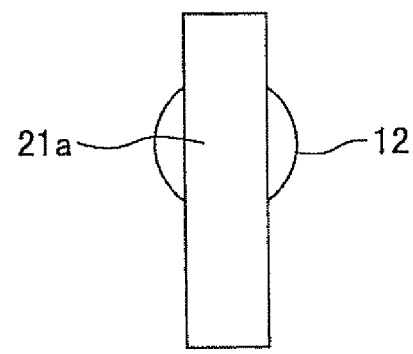

FIGS. 2A and 2B are pattern diagrams for explaining the length k of the plated metal infiltration part 21d as well as whether the bonding between the bump 12 and the wiring 21 is good or bad. As shown in FIG. 2A, if the area of a plated metal infiltration part 21d is sufficiently large, the length k of the plated metal infiltration part 21d, for example, either satisfies or surpasses the reference value. In such a case, the bonding strength between the end part 21a of the wiring 21 and the bump 12 can be judged as good.

FIG. 2B shows a case in which there is almost no plated metal infiltration part 21d. In such a case, the bonding strength between the end part 21a of the wiring 21 and the bump 12 is low, permitting judgment that the bonding is bad.

Figure 3:
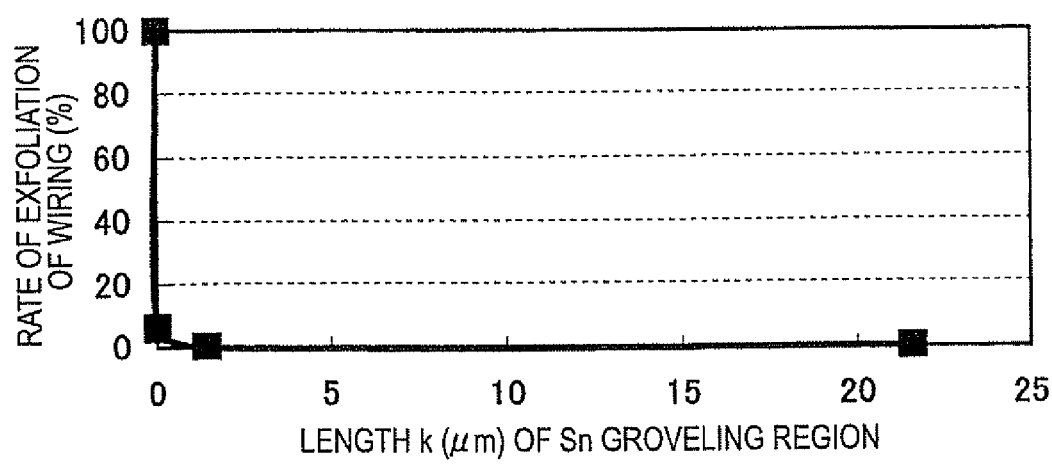
FIG. 3 is a graph showing one example of correlation between the length k of the plated metal infiltration part 21d and rate of exfoliation of the wiring.

FIG. 3 is a graph that shows an example of the correlation between the length k of the plated metal infiltration part 21d and the rate of peeling of the wiring. Where k=0, peeling was observed between the end part 21a of the wiring 21 and the bump 12 in almost every sample. In contrast, where k=1.4 μm, no peeling was observed between the end part 21a and the bump 12 in almost every sample. Consequently, under the conditions where the measurement of FIG. 3 was performed, for example, the bonding between the end part 21a of the wiring 21 and the bump 12 can be judged as good if k≧1.4 μm.

As has been described above, the bonding between the end part 21a of the wiring 21 and the bump 12 can be judged as either good or bad in a nondestructive manner by bonding the bump 12 of the semiconductor chip 10 and the end part 21a of the wiring 21 and then measuring the area, the width or the length of the plated metal infiltration part 21d in order to judge whether the result of the measurement satisfies the reference value or not. If the bonding between the bump 12 and the end part 21a is bad, it can be judged, for example, that some trouble has occurred in a unit that is employed in the heat treating process for removing moisture.

Second Embodiment

Figure 4:
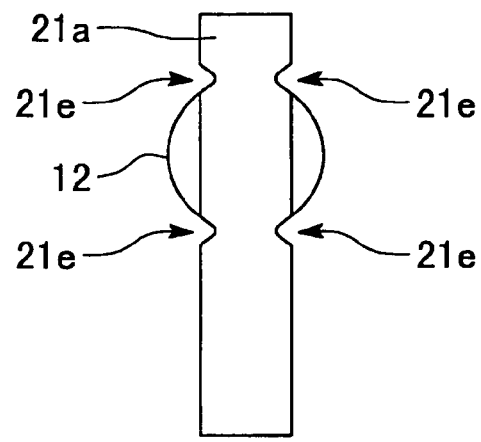
FIG. 4 is a pattern diagram for explaining a method for manufacturing a semiconductor device according to a second embodiment of the invention.
Figure 5:
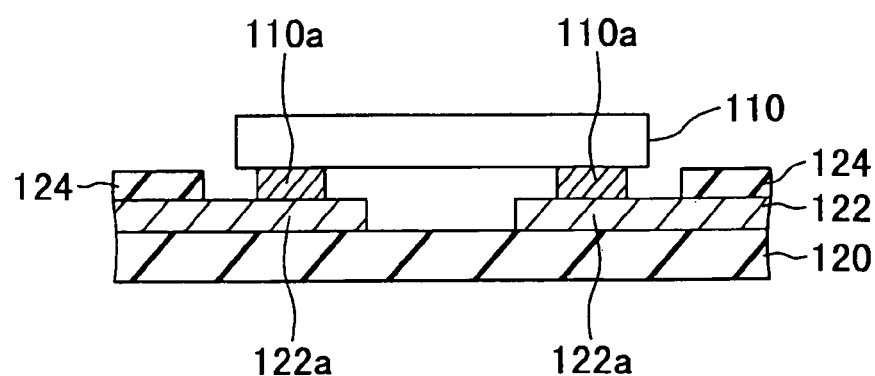
FIG. 5 is a cross-sectional view explaining a structure of a semiconductor device having a semiconductor chip 110 mounted on a wiring board.

Referring to FIG. 4, the second embodiment of the invention will be described. FIG. 4 shows a planar shape of the end portion 21a of the wiring 21. A method for manufacturing a semiconductor device according to the present embodiment is the same as the method according to the first embodiment, except that the end portion 21a here has a notch part 21e. The notch part 21e is formed, for example, by a process to selectively remove the metal layer to form the wiring 21.

The method according to the present embodiment permits an effect similar to that of the first embodiment to be obtained. In addition, it facilitates the melted plated layer 21b to gather at the notch part 21e at the time of the bonding and, as a result, enhances the size of the fillet 21c and contributes to the bonding strength between the end part 21a of the wiring 21 and the bump 12.

The method also prevents any distortion, having been created at the end part 21a by the bump 12 pressed against the end part 21a, from being passed on to the end of the end part 21a as the bump 12 is pressed against the end part 21a to peel off the portion of the end part 21a around the bump 12 from the base substrate 20. Consequently, the method prevents the end of the end part 21a from exfoliating from the base substrate 20.

The present invention is not limited to the above described embodiments but can be implemented in various modified ways without deviating from the scope and spirit of the invention.

What is claimed is:

1. A method for manufacturing a semiconductor device, comprising:
preparing a wiring board having a base substrate and wiring on the base substrate, the wiring being plated on surface with a plating metal;

pressing a bump formed on an active side of a semiconductor chip against an end part of the wiring of the wiring board so as to exfoliate a region around a portion of the wiring pressed by the bump while having end of the wiring kept bonded with the base substrate;

melting the plating metal that is located on the end part of the wiring so as to form an alloy of the plating metal and the bump so as to bond the bump and the wiring, and infiltrating the plating metal into a space between the wiring and the base substrate; and judging that the bump and the wiring are well bonded if the plating metal that has infiltrated into the space between the wiring and the base substrate has an area, a width or a length of infiltration that satisfies or surpasses a reference level.

2. The method for manufacturing a semiconductor device according to claim 1, wherein:

the semiconductor device includes a protective layer that is formed on the base substrate and the wiring to cover a region except for the end part of the wiring;

a distance between the portion of the wiring pressed by the bump and the end of the wiring is at least 40 μm; and the wiring has a thickness of 10 μm or less.

3. The method for manufacturing a semiconductor device according to claim 1 further comprising a notch part, the notch part being formed on the end part of the wiring and located near a portion to be pressed by the bump.

4. The method for manufacturing a semiconductor device according to claim 1, wherein the wiring is copper wiring and the plating metal is Sn.

* * * * *